United States Patent [19]
Thewes et al.

[11] Patent Number: 5,990,709
[45] Date of Patent: Nov. 23, 1999

[54] CIRCUIT FOR COMPARING TWO ELECTRICAL QUANTITIES PROVIDED BY A FIRST NEURON MOS FIELD EFFECT TRANSISTOR AND A REFERENCE SOURCE

[75] Inventors: Roland Thewes, Puchheim; Stefan Prange, Munich; Erdmute Wohlrab, Munich; Werner Weber, Munich, all of Germany

[73] Assignee: Siemens Aktiengesellschaft, Munich, Germany

[21] Appl. No.: 08/973,447

[22] PCT Filed: Jun. 3, 1996

[86] PCT No.: PCT/DE96/00972

§ 371 Date: Dec. 4, 1997

§ 102(e) Date: Dec. 4, 1997

[87] PCT Pub. No.: WO96/42050

PCT Pub. Date: Dec. 27, 1996

[30] Foreign Application Priority Data

Jun. 9, 1995 [DE] Germany ............... 195 21 090

[51] Int. Cl.⁶ ................................ H03K 5/153
[52] U.S. Cl. .................. 327/89; 327/77; 327/53
[58] Field of Search ................. 327/52, 53, 63, 327/64, 65, 66, 77, 78, 79, 82, 88, 89, 560–563; 326/35, 36, 115; 365/185.1, 185.2, 185.21

[56] References Cited

U.S. PATENT DOCUMENTS

| 3,950,636 | 4/1976 | Dao . | |
|---|---|---|---|
| 5,483,184 | 1/1996 | Kuo | 327/83 |
| 5,812,022 | 9/1998 | Hirano et al. | 327/66 |
| 5,852,416 | 12/1998 | Ohmi et al. | 341/144 |

FOREIGN PATENT DOCUMENTS 0 497 319 A1  5/1992  European Pat. Off. .

OTHER PUBLICATIONS

IEEE Transactions on Electron Devices, vol. 39, No. 6, Jun. 1992, XPO00271791, T. Shibata et al, A Functional MOS Transistor Featuring Gate–Level Weighted Sum & Threshold Operations, pp. 1444–1455.

IEEE Transactions on Electron Devices, vol. 40, No. 5, May 1993, XPO00364271, T. Shibata et al, Neuron MOS Binary–Logic Integrated Circuits, Part II: Simplifying Techniques of Circuit Configuration and their Practical Applications, pp. 974–979.

IEICE Transactions on Fundamentals of Electronics, Communica–tions & Computer Sciences, vol. E75–A, No. 7, Jul. 1992, K. Tsukano et al, A New CMOS Neuron Circuit Based on a Cross–Coupled Current Comparator Structure, pp. 937–943.

ALTA Frequenza, vol. XXXXVIII, No. 11, Nov. 1969, D. Ferrari et al, Some New Schemes for Parallel Multipliers, pp. 843–852.

U. Tietze, Ch. Schenk, Halbleiterschaltungstechnik, 9 Auflage, Springer–Verlag, 1990, pp. 132–143.

*Primary Examiner*—Toan Tran
*Attorney, Agent, or Firm*—Hill & Simpson

[57] ABSTRACT

The circuit arrangement compares a quantity supplied by a first neuron MOS field effect transistor (M1) to a reference quantity that is made available by a reference source (R). A current mirror (SP) is provided therefor, this enabling a comparison of a second current ($I_2$) supplied by a reference transistor (R) to a first current ($I_1$) supplied by the first neuron MOS field effect transistor (M1). The evaluator circuit is activated or, respectively, decoupled by a first switch unit (S1) and a second switch unit (S2). What is thereby achieved is that no current flows in the evaluator circuit in the quiescent condition. The comparison result is applied to an inverter unit (IS). Since the inverter unit (IS) is decoupled from the evaluator circuit by the first switch unit (S1), an undefined level is never adjacent at the output (AIS) of the inverter unit (IS). This can be advantageously utilized in the further data processing in following stages.

17 Claims, 3 Drawing Sheets

CIRCUIT FOR COMPARING TWO ELECTRICAL QUANTITIES PROVIDED BY A FIRST NEURON MOS FIELD EFFECT TRANSISTOR AND A REFERENCE SOURCE

BACKGROUND OF THE INVENTION

The job of comparing two electrical quantities to one another occurs in many fields of technology. For example, these comparisons are thus a foundation of electrical mensuration technology. Threshold equations can also be technically realized with the assistance of evaluator circuits.

Methods that compare electrical quantities with the assistance of operational amplifiers are known and are often employed (U. Tietze, Ch. Schenk, Halbleiterschaltungstechnik, 9th Edition Springer Verlag, 1990, pages 132 through 143). A significant disadvantage of these methods is comprised in the conversion of static dissipated power and in the comparatively large space requirement of such circuits, particularly when a great number of them are required. A further possibility of implementing an evaluation of two electrical quantities is comprised in the employment of a neuron MOS inverter, whereby the reference quantity to which another electrical quantity is to be compared is determined by the switching threshold of the neuron MOS inverter (T. Shibata and T. Ohmi, "A function MOS Transistor featuring gate-level weighted sum and threshold operations", IEEE Trans. Electron Devices, 39, 1992, pages 1444–1455). The employment of a neuron MOS inverter in this context exhibits a number of disadvantages. A static quadrature-access current component for all potentials flows on the floating gate $\phi_F$ with $V_{SS}+V_{th,n}<\phi_F<V_{DD}-V_{th,p}$, this corresponding to the normal case during operation as threshold gate. Moreover, it is necessary to govern the technology parameters extremely well, so that the threshold dimensioning corresponds to the desired behavior, i.e. that narrow tolerances of the threshold voltage must be adhered to.

European reference EP 0 497 319 A1 discloses a circuit arrangement for the comparison of two electrical quantities that comprises a current mirror, two MOS field effect transistors as well as an inverter unit. The currents supplied by the two transistors are compared to one another in the current mirror and the result signal is offered at the output of the inverter unit. This circuit arrangement only makes a comparison of two electrical quantities possible.

Fundamentals about the neuron MOS field effect transistor are known from T. Shibata, A Functional MOS Transistor Featuring Gate-Level Weighted Sum and Threshold Operations, IEEE Transactions on Electron Devices, Vol. 39, No. 6, New York, pp. 1144–1455, June 1992.

U.S. Pat. No. 3,850,635 discloses a multiplier cell containing two comparators.

SUMMARY OF THE INVENTION

The invention is based on the problem of comparing an electrical quantity that is made available by a neuron MOS field effect transistor to a reference quantity.

In general terms the present invention is a circuit arrangement for the comparison of two electrical quantities that are made available by a first neuron MOS field effect transistor and a reference transistor. A current mirror is provided. An output of the first neuron MOS field effect transistor is coupled via a first terminal to an output of the current mirror, and an output of the reference transistor is coupled to an input of the current mirror. The first terminal is connected to at least one terminal of an inverter unit at whose output a result signal of the comparison pends.

Advantageous developments of the present invention are as follows.

A first switch unit is provided that is connected to the first terminal and to the control terminal of the inverter unit.

A second switch unit is provided, whereby a first terminal of the second switch unit is connected via a second terminal to an input of the first neuron MOS field effect transistor and to an input of the reference transistor.

The reference transistor is formed by a second neuron MOS field effect transistor.

The reference transistor is formed by an MOS field effect transistor.

The first switch unit and the second switch unit is composed of an MOS field effect transistor.

The first switch unit or the second switch unit is composed of an MOS field effect transistor.

The first switch unit and the second switch unit are controlled by a common control signal.

A buffer unit is provided for buffering the result signal, the input thereof being connected to the output of the inverter unit.

The present invention is also a binary multiplier cell having two circuit arrangements for the operation of a multiplier bit, a multiplicand bit, a sum bit of a preceding partial product and a carry bit of a preceding partial product as input potentials to form an output sum bit and an output carry bit.

A first evaluator circuit is provided for forming the output carry bit. A second evaluator circuit is provided for forming the output sum bit. A second inverter unit is provided, whereby the output carry bit is adjacent at an input of the second inverter unit and a negated output carry bit is adjacent at an output of the second inverter unit. The multiplier bit, the multiplicand bit, the sum bit of a preceding partial product and the carry bit of a preceding partial product are applied weighted to gate terminals of the first neuron MOS field effect transistor of the first evaluator circuit and to gate terminals of the first neuron MOS field effect transistor of the second evaluator circuit. The negated output carry bit is adjacent weighted at a further gate terminal of the first neuron MOS field effect transistor of the second evaluator circuit.

The inventive circuit arrangement has a number of positive properties. Thus, at no point in time does an undefined level pend at the output of the inventive circuit arrangement since a switch is made directly from the old into the new condition. This property is advantageous in the further data processing in following stages.

Further, the evaluation ensues via currents and not via charges, as is often standard in other evaluator circuits. These currents derive from the potentials at (floating) gates of the transistors that can be offered low-impedance in an overall circuit. The inventive circuit arrangement is thus rugged with respect to the emission of noise signals and allows a more reliable evaluation than the principle of charge evaluation. For example, narrow tolerances for the threshold formation in the realization of threshold equations can thereby be adhered to since work is carried out in difference mode. Such slight differences in potential at the floating gate of 200 mV can thus even be reliably separated and correctly evaluated.

A further advantage of the inventive circuit arrangement is comprised therein that no quadrature-axis current component flows in the quiescent condition of the circuit arrangement, this representing an important advantage over many other evaluator circuits.

For employment in array circuits, the inventive circuit arrangement offers the advantage that only one control line is required in order to activate the inventive circuit arrangement.

An area comparison to other evaluator circuits shows that the inventive circuit arrangement has advantages when value is placed on a decoupling of output and actual evaluator circuit as well as on freedom from quadrature-axis current components. This is illustrated by the fact that the inventive circuit arrangement requires only six transistors for the logic as well as one neuron MOS field effect transistor and a reference source that likewise comprises a further neuron MOS field effect transistor or an MOS field effect transistor.

BRIEF DESCRIPTION OF THE DRAWINGS

The feature of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and which:

DESCRIPTION OF THE PREFERRED EMBODIMENTS

The inventive circuit arrangement is explained in greater detail with reference to FIGS. 1 through 3.

Figure 1:
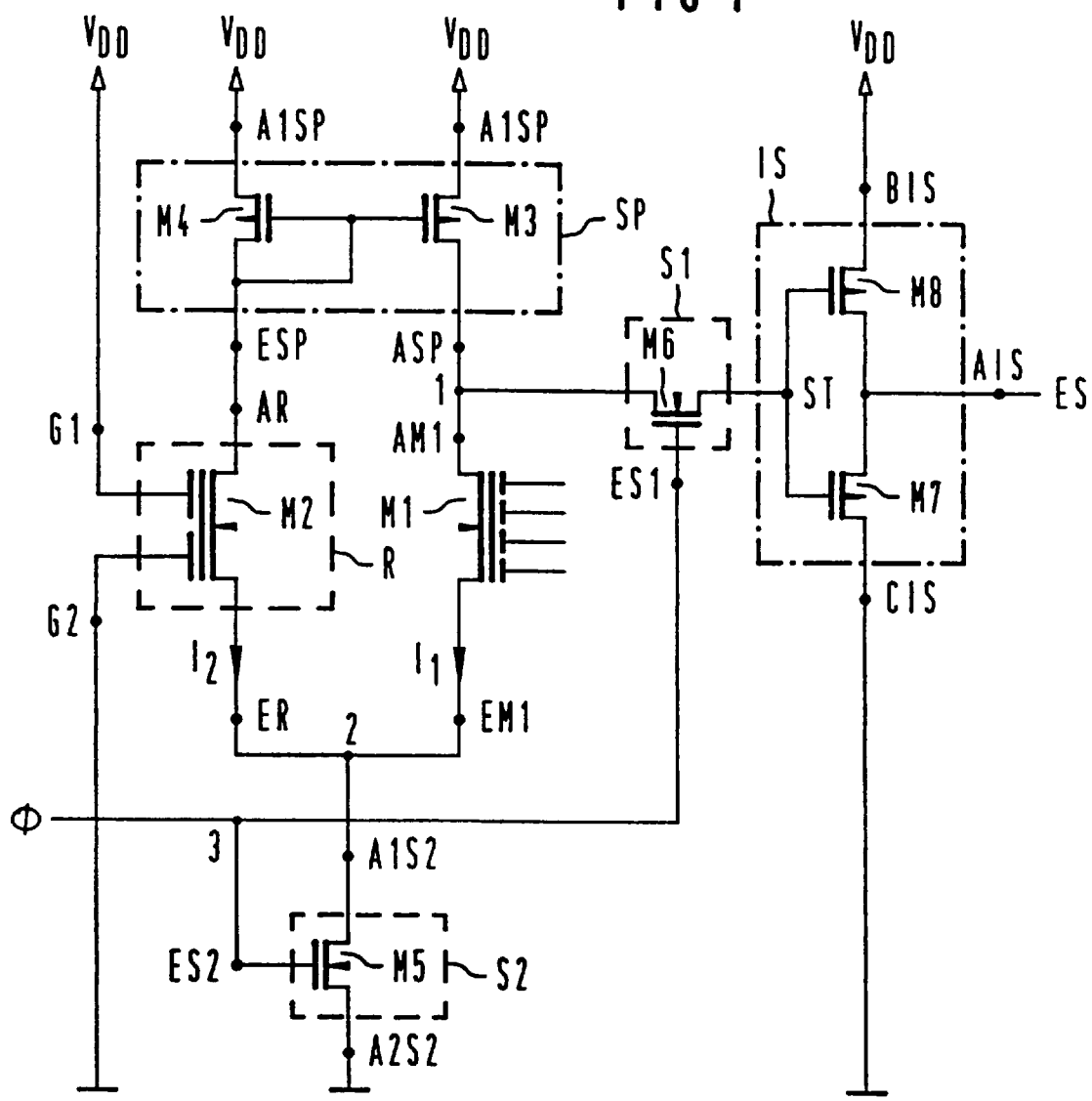
FIG. 1 a sketch of the inventive circuit arrangement.

FIG. 1 shows an inventive circuit arrangement for the comparison of two electrical quantities that are made available by a first neuron MOS field effect transistor M1 and a reference source R. The inventive circuit arrangement fundamentally comprises the following components:
a first current mirror SP,
the first neuron MOS field effect transistor M1,
a reference transistor R, as well as
an inverter unit IS.

A first switch unit S1 as well as a second switch unit S2 can also be additionally present. The first switch unit S1 and the second switch unit S2 are not critical for the function of the inventive circuit arrangement.

The components listed above are connected to one another in the following way: The first neuron MOS field effect transistor M1 has an output AM1 of the first neuron MOS field effect transistor M1 connected via a first terminal 1 to an output ASP of the current mirror SP. An output AR of the reference transistor R is connected to an input ESP of the current mirror SP. An input EM1 of the first neuron MOS field effect transistor M1 and an input ER of the reference transistor R are coupled via a second terminal 2 to a first terminal A1S2 of the second switch unit S2. A second terminal A2S2 of the second switch unit S2 is connected to the ground potential. The first terminal 1 is connected to the first switch unit S1. The first switch unit S1 is also coupled to a control terminal ST of the inverter unit IS.

The current mirror SP is composed of two transistors M3 and M4. The inverter unit IS comprises two transistors M7 and M8. The first switch unit S1 comprises a transistor M6, and the second switch unit S2 comprises a transistor M5. A first terminal A1SP of the current mirror SP as well as a second terminal A2SP of the current mirror AP are coupled to an operating potential $V_{DD}$. A terminal BIS of the inverter unit is likewise coupled to the operating potential $V_{DD}$. One terminal CIS of the inverter unit IS lies at ground.

A control input ES1 of the first switch unit as well as a control input ES2 of the second switch unit are coupled via a terminal 3 to a control signal $\phi$.

The above-described inventive circuit arrangement generates a floating gate potential $\phi_F$ of the first neuron MOS field effect transistor that represents the input quantities applied to the gate terminals of the first neuron MOS field effect transistor M1. During the evaluation, the ratio of a first current $I_1$ that flows through the first neuron MOS field effect transistor M1 and a second current $I_2$ that flows through the reference transistor R is a function of the difference of the floating gate potentials of the first neuron MOS field effect transistor M1 and of the reference transistor R. What is to be understood by active evaluation in this context is that the circuit arrangement is activated by the first switch unit S1 as well as by the second switch unit S2. The control signal $\phi$ must be active therefor. When the control signal $\phi$ is switched to high level, the result of the evaluation pends at the first terminal 1, whereby a full CMOS boost is not yet achieved. This is first achieved at an output AIS of the inverter unit IS.

The control signal $\phi$ is deactivated after the conclusion of the evaluation, as a result whereof both the first switch unit S1 as well as the second switch unit turn off. This effects a decoupling of the inverter unit IS and of the ground potential from the actual evaluator circuit. Due to the charge preservation at the gates of the transistors M7 and M8 of the inverter unit IS, defined levels are maintained at the output AIS of the inverter unit IS for an adequately long time, a result signal ES of the comparison. The result signal ES can be further-processed without problems in following circuits. What is achieved by this circuit arrangement is that an undefined level is not adjacent at the output AIS of the inverter unit IS at any point in time. This property can be advantageously utilized in the further data processing in following units.

Simulations have shown that the function of the can still reliably evaluate voltage differences at the floating gate $\phi_F$ of the first neuron field effect transistor $\phi_F$ from 200 mV. The particular reason for this is especially that the evaluation in the inventive circuit arrangement occurs via currents through the transistors M1 and M2 that are in turn generated by potentials pending low-impedance at their gates. The evaluation is thus resistant to high-frequency noise emissions and allows a reliable evaluation. Narrow tolerances for the threshold formation can thus also be adhered to.

Figure 2:
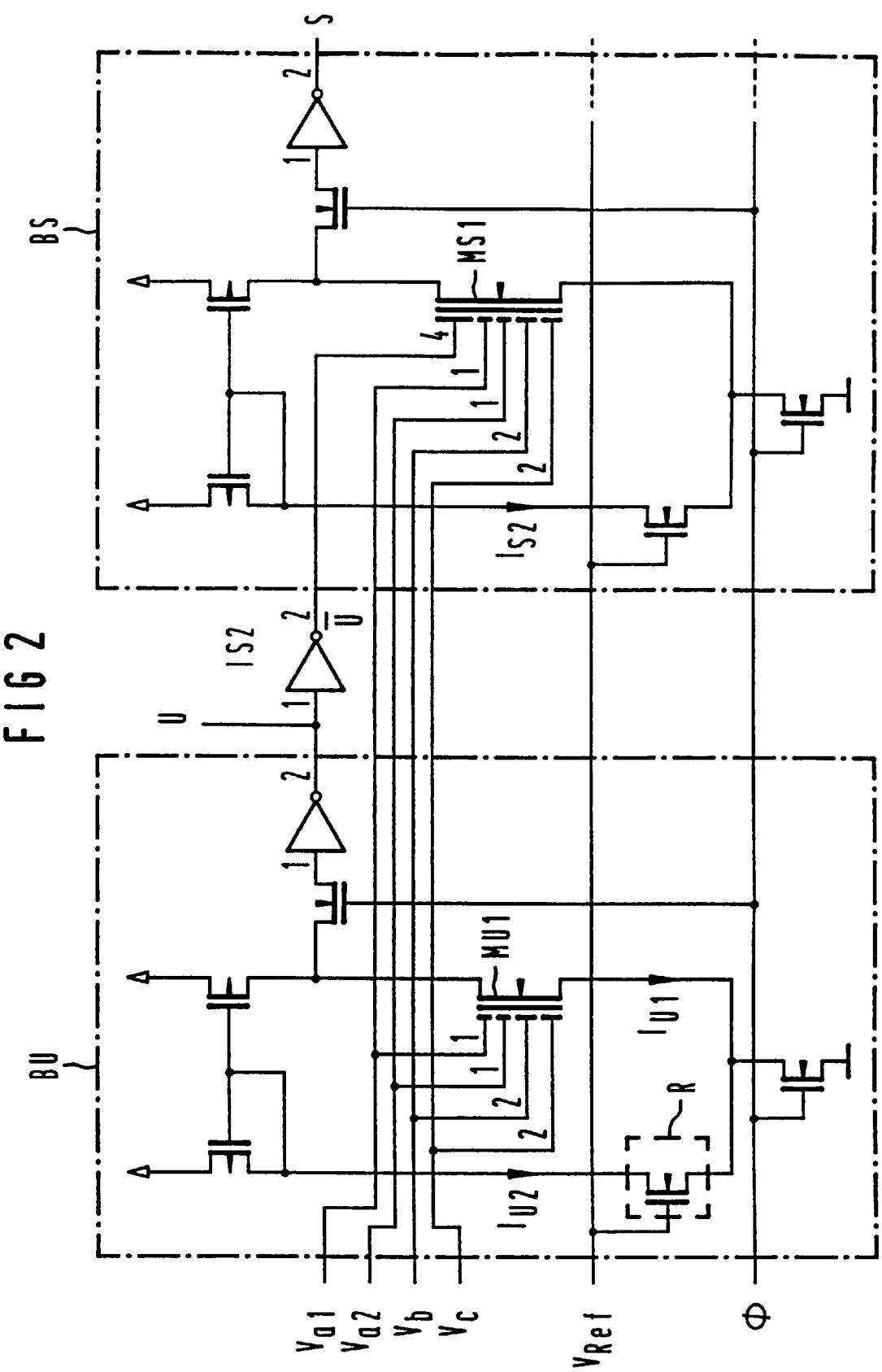
FIG. 2 a sketch that shows the employment of the inventive circuit arrangement in a multiplier cell.

The reference transistor R can be formed both of a second neuron MOS field effect transistor M2 (see FIG. 1) as well as of an MOS field effect transistor (see FIG. 2). When the reference transistor R is composed of the second neuron MOS field effect transistor M2, then at least two gate terminals are provided, whereby a first gate terminal G1 lies at the operating potential VDD and a second gate terminal G2 lies at ground. A third gate terminal can be provided for the fine adjustment of the floating gate potential of the second neuron MOS field effect transistor M2 and, thus, of the switching threshold of the evaluator circuit.

When an MOS field effect transistor as described in FIG. 2 is employed, then this requires an externally supplied or internally generated reference voltage $V_{ref}$. This can be advantageous when a fine adjustment of the gate potential of the reference transistor R, thus, of the switching threshold of the evaluator circuit is desired. A further advantage is comprised therein that an MOS field effect transistor requires less space than a neuron MOS field effect transistor and that an existing reference voltage that is converted into the first current $I_1$ given employment within the circuit can be utilized for an arbitrary plurality of evaluator circuits.

FIG. 2 describes an employment of the inventive circuit arrangement for the realization of a binary multiplier cell. The binary multiplier cell is composed of a first evaluator circuit BU for the formation of a carry bit ü of the binary multiplier cell and of a second evaluator circuit BS for the formation of a sum bit s of the binary multiplier cell. Both the first evaluation circuit BU as well as the second evaluation circuit BS correspond to the structure of the inventive circuit arrangement (see FIG. 1).

A binary multiplier cell forms the product of two bits and adds the partial product of other multiplier cells.

The gate terminals of both the first neuron MOS field effect transistor MU1 of the first evaluator circuit BU as well as the gate terminals of the first neuron MOS field effect transistor MS1 of the second evaluator circuit BS are respectively connected to input potentials $V_{a1}$, $V_{a2}$, $V_b$ and $V_c$. The input potential $V_{a1}$ thereby represents a multiplier bit, the input potential $V_{a2}$ represents a multiplicand bit that are both processed in the multiplier cell. The input potential $V_b$ represents the sum bit of a preceding partial product. The input potential $V_c$ represents the carry bit of a preceding partial product. The input potentials $V_{a1}$, $V_{a2}$, $V_b$ and $V_c$ are weighted at the first neuron MOS field effect transistor MU1 of the first evaluator circuit BU and at the first neuron MOS field effect transistor MS1 of the second evaluator circuit BS in such a way that the input potentials $V_{a2}$ and $V_2$ are singly weighted and $V_b$ and $V_c$ are doubly weighted relative thereto. The first evaluator circuit BU forms a carry bit U. The carry bit U is inverted in a second inverter unit IS2 and applied to to a further gate terminal of the first neuron MOS field effect transistor. The weighting of the negated carry bit amounts to 4 relative to the weighting of, for example, the input potential $V_{a1}$.

The comparison occurring in the first evaluator circuit BU given activated evaluator circuit BU represents a technical realization of a threshold equation. The logical value of the carry bit u of the first evaluator circuit BU is logical 1 when and only when, given activated control signal φ, the first current $I_0 1$ of the first evaluator circuit BU is greater than the reference current $I_0 2$. With the above-described weighting of the input potentials at the gate terminals of the first neuron MOS field effect transistor MÜ1 of the first evaluator circuit BU, the first evaluator circuit BU represents the following threshold equation overall:

$$a_1+a_2+2b=2c>3.5. \qquad (1)$$

$a_1$ and $a_2$ thereby represent the multiplier bit and the multiplicand bit that are processed in the multiplier cell. The sum bit of a preceding partial product is represented by symbol b. The carry bit of a preceding partial product is identified by the symbol c.

The second evaluator circuit BS of the multiplier cell forms a sum bit of the multiplier cell from the above-described input potentials and the negated output carry bit u—weighted four-fold—of the first evaluator circuit BU described above. The negated carry bit u is thereby weighted with the value 4 and is connected to a further gate terminal of the first neuron MOS field effect transistor MS1 of the second evaluator circuit. The function of the second evaluator circuit BS corresponds to that of the above-described inventive circuit arrangement, as shown in FIG. 1. The threshold equation represented by the second evaluator circuit BS thus reads:

$$a_1+a_2+2b+2c+4u>5.5. \qquad (2)$$

The variables of the above equation thereby represent the same quantities as the variables in equation (1).

The same reference signals for the first evaluator circuit BU and the second evaluator circuit BS are employed in the circuit arrangement of FIG. 2. The position of the respective threshold (3.5 or, respectively, 5.5) derives in that the capacitances of the inputs of the respective neuron MOS field effect transistor to the floating gate and the capacitance of the floating gate to the active transistor zone are summed up and divided by 2.

The following table recites a truth table for the binary multiplication for confirmation of the functioning of the multiplier cell described above.

| $a_1$ | $a_2$ | b | c | ü | s | $a_1/2+a_2/2+b+c$ | $a_1/2+a_2/2+b+c-2ü$ |
|---|---|---|---|---|---|---|---|
| 0 | 0 | 0 | 0 | 0 | 0 | 0 | 0 |
| 0 | 0 | 0 | 1 | 0 | 1 | 1 | 1 |
| 0 | 0 | 1 | 0 | 0 | 1 | 1 | 1 |
| 0 | 0 | 1 | 1 | 1 | 0 | 2 | 0 |
| 0 | 1 | 0 | 0 | 0 | 0 | 0.5 | 0.5 |
| 0 | 1 | 0 | 1 | 0 | 1 | 1.5 | 1.5 |
| 0 | 1 | 1 | 0 | 0 | 1 | 1.5 | 1.5 |
| 0 | 1 | 1 | 1 | 1 | 0 | 2.5 | 0.5 |
| 1 | 0 | 0 | 0 | 0 | 0 | 0.5 | 0.5 |
| 1 | 0 | 0 | 1 | 0 | 1 | 1.5 | 1.5 |
| 1 | 0 | 1 | 0 | 0 | 1 | 1.5 | 1.5 |
| 1 | 0 | 1 | 1 | 1 | 0 | 2.5 | 0.5 |
| 1 | 1 | 0 | 0 | 0 | 1 | 1 | 1 |
| 1 | 1 | 0 | 1 | 1 | 0 | 2 | 0 |
| 1 | 1 | 1 | 0 | 1 | 0 | 2 | 0 |
| 1 | 1 | 1 | 1 | 1 | 1 | 3 | 1 |

Figure 3:
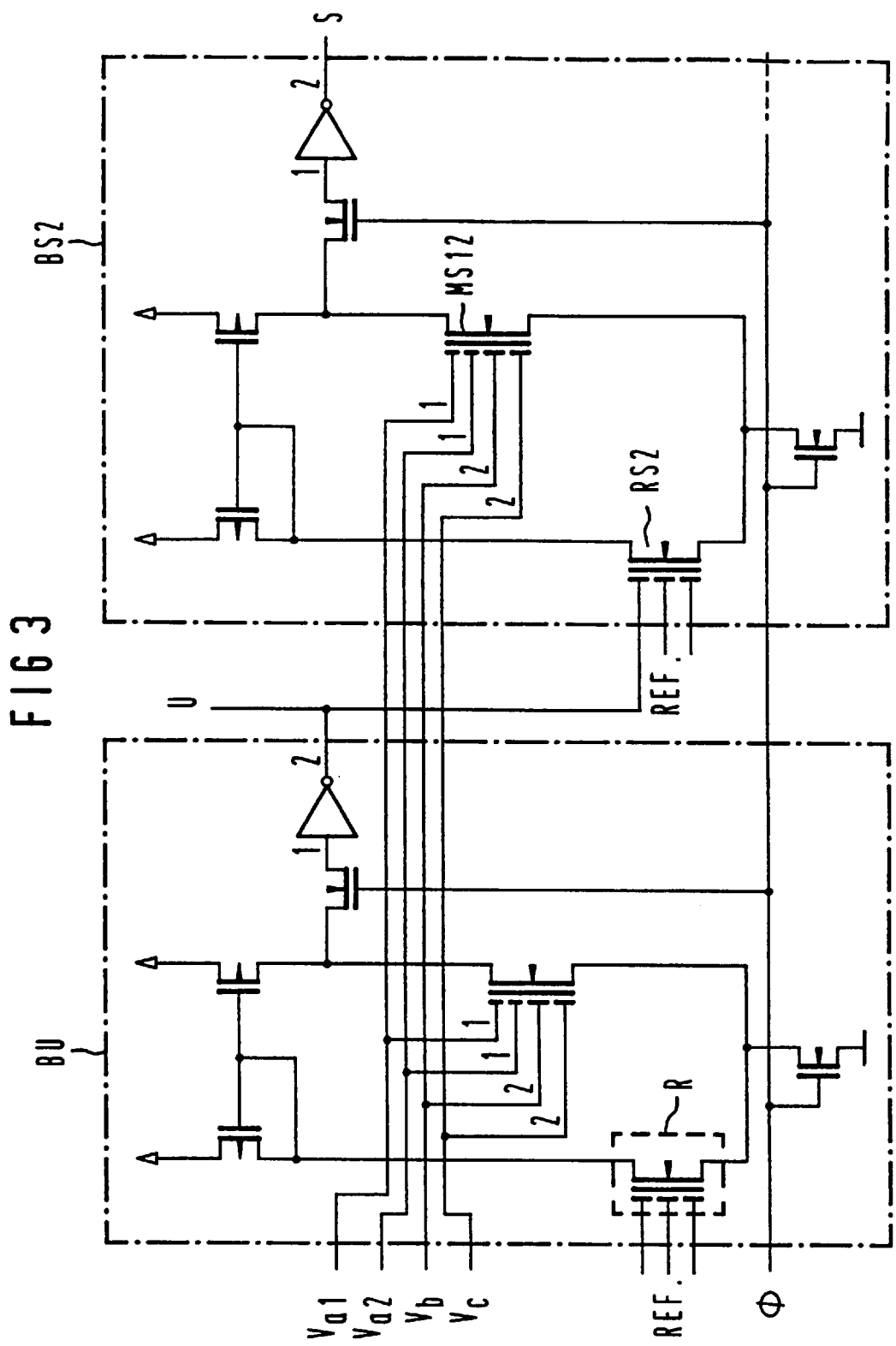
FIG. 3 a sketch that shows the employment of the inventive circuit arrangement within a multiplier cell, whereby the carry bit is directly employed in the reference neuron MOS field effect transistor.

FIG. 3 describes a further possibility of constructing a binary multiplier cell upon employment of the inventive circuit arrangement. The reference transistor R is thereby formed by a neuron MOS field effect transistor in the first evaluator circuit BU. Otherwise, the structure of the first evaluator circuit BU corresponds to that provided in FIG. 2. Differing from the second evaluator circuit BS shown in FIG. 2, applying the carry bit in negated form to a gate terminal of a first neuron MOS field effect transistor MS12 of the third evaluator circuit BS2 is not provided in the third evaluator circuit BS2; rather, the carry bit u is directly applied in non-negated form to a further gate terminal of a reference neuron MOS field effect transistor of the third evaluator circuit BS2. The third evaluator circuit BS2 described in FIG. 3 thus represents the following inequation corresponding to the designations employed above:

$$a_1+a_2+2b+2c<1.5+4u \qquad (3)$$

The carry bit is thus weighted four-fold relative to, for example, the multiplicand bit. The overall term (1.5+4ü) is achieved by a corresponding dimensioning of the input capacitances to the floating gate of the reference neuron MOS field effect transistor RS2 of the third evaluator circuit BS2. This dimensioning as well as all other occurring transistors in the inventive circuit arrangement can be easily calculated and implemented by a person skilled in the art.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement for comparing two electrical quantities that are made available by a first neuron MOS field effect transistor and a reference transistor, respectively, comprising:

a current mirror having an output and an input;

the first neuron MOS field effect transistor having an output coupled via a first terminal to the output of the current mirror, and the reference transistor having an output coupled to the input of the current mirror;

an inverter unit having at least one terminal and an output, the first terminal connected to the at least one terminal of the inverter unit at whose output a result signal of the comparison pends; and a first switch unit connected to the first terminal and to an input terminal of the inverter unit, the at least one terminal being a control terminal.

2. The circuit arrangement according to claim 1, wherein the arrangement further comprises a second switch unit, the second switch unit having a first terminal connected to an input of the first neuron MOS field effect transistor and to an input of the reference transistor.

3. The circuit arrangement according to claim 1, wherein the reference transistor is a second neuron MOS field effect transistor.

4. The circuit arrangement according to claim 1, wherein the reference transistor is an MOS field effect transistor.

5. The circuit arrangement according to claim 2, wherein one of the first switch unit and the second switch unit is an MOS field effect transistor.

6. The circuit arrangement according to claim 2, wherein the first switch unit and the second switch unit are MOS field effect transistors.

7. The circuit arrangement according to claim 2, wherein the first switch unit and the second switch unit are controlled by a common control signal.

8. The circuit arrangement according to claim 1, wherein the arrangement further comprises a buffer unit for buffering the result signal the buffer unit having an input connected to the output of the inverter unit.

9. A binary multiplier cell for operation of a multiplier bit, a multiplicand bit, a sum bit of a preceding partial product and a carry bit of a preceding partial product as input potentials to form an output sum bit and an output carry bit, comprising:

a first evaluator circuit for forming the output carry bit;

a second evaluator circuit for forming the output sum bit;

each of the first and second evaluator circuits having a first neuron MOS field effect transistor and a reference transistor, having a current mirror, an output of the first neuron MOS field effect transistor coupled via a first terminal to an output of the current mirror, and an output of the reference transistor coupled to an input of the current mirror, the first term final connected to at least one terminal of a first inverter unit at whose output a result signal pends, the result signal being a carry bit;

a second inverter unit, whereby the output of the first inverter is connected at an input of the second inverter unit and a negated output carry bit is therefore present at an output of the second inverter unit;

the multiplier bit, the multiplicand bit, the sum bit of a preceding partial product and the carry bit of a preceding partial product are applied weighted to gate terminals of the first neuron MOS field effect transistor of the first evaluator circuit and to gate terminals of the first neuron MOS field effect transistor of the second evaluator circuit; and the negated output carry bit is forwarded weighted to a further gate terminal of the first neuron MOS field effect transistor of the second evaluator circuit the output of said second inverter unit being connected to said further gate terminal.

10. The circuit arrangement according to claim 9, wherein the arrangement further comprises a first switch unit connected to the first terminal and to an input terminal of the inverter unit, the at lest one terminal being a control terminal.

11. The circuit arrangement according to claim 10, wherein the arrangement further comprises a second switch unit, the second switch unit having a first terminal connected to an input of the first neuron MOS field effect transistor and to an input of the reference transistor.

12. The circuit arrangement according to claim 9, wherein the reference transistor is a second neuron MOS field effect transistor.

13. The circuit arrangement according to claim 9, wherein the reference transistor is an MOS field effect transistor.

14. The circuit arrangement according to claim 11, wherein the first switch unit and the second switch unit are MOS field effect transistors.

15. The circuit arrangement according to claim 11, wherein one of the first switch unit and the second switch unit is an MOS field effect transistor.

16. The circuit arrangement according to claim 9, wherein the first switch unit and the second switch unit are controlled by a common control signal.

17. The circuit arrangement according to claim 11, wherein the arrangement further comprises a buffer unit for buffering the result signal, the buffer unit having an input connected to the output of the inverter unit.

* * * * *